(12) United States Patent
Kubouchi et al.

(10) Patent No.: US 9,543,037 B2
(45) Date of Patent: Jan. 10, 2017

(54) SEMICONDUCTOR DEVICE HAVING ELECTRICAL FUSE AND CONTROL METHOD THEREOF

(75) Inventors: Shuichi Kubouchi, Tokyo (JP); Daiki Nakashima, Tokyo (JP)

(73) Assignee: Longitude Semiconductor S.A.R.L., Luxembourg (LU)

( * ) Notice: Subject to any disclaimer, the term of this patent is extended or adjusted under 35 U.S.C. 154(b) by 212 days.

(21) Appl. No.: 13/296,437

(22) Filed: Nov. 15, 2011

(65) Prior Publication Data

US 2012/0120750 A1     May 17, 2012

(30) Foreign Application Priority Data

Nov. 16, 2010   (JP) ................... 2010-255526

(51) Int. Cl.
*G11C 17/18*     (2006.01)
*G11C 29/00*     (2006.01)

(52) U.S. Cl.
CPC ............. *G11C 17/18* (2013.01); *G11C 29/785* (2013.01); *G11C 29/789* (2013.01)

(58) Field of Classification Search
USPC .................. 365/96, 189.011, 225.7, 203
See application file for complete search history.

(56) References Cited

U.S. PATENT DOCUMENTS

| | | | |
|---|---|---|---|
| 5,838,624 A * | 11/1998 | Pilling et al. ............... | 365/225.7 |
| 6,346,845 B1 * | 2/2002 | Choi ........................ | 327/525 |
| 6,351,425 B1 * | 2/2002 | Porter ...................... | 365/225.7 |
| 7,902,902 B2 * | 3/2011 | Chu et al. .................. | 327/525 |
| 2007/0278616 A1 | 12/2007 | Ueda | |

FOREIGN PATENT DOCUMENTS

JP     2007-329196 A     12/2007

* cited by examiner

*Primary Examiner* — Douglas King

(57) ABSTRACT

To provide an electrical fuse that is connected to a detection node via a selective transistor, a precharge transistor that precharges the detection node in a state where the selective transistor is off; a bias transistor that passes a bias current to the detection node in a state where the selective transistor is on and the precharge transistor is off, and a detection circuit that detects a potential of the detection node in a state where the bias current is flowing into the detection node, wherein the bias transistor reduces an amount of the bias current in a stepwise manner or a continuous manner.

10 Claims, 5 Drawing Sheets

SEMICONDUCTOR DEVICE HAVING ELECTRICAL FUSE AND CONTROL METHOD THEREOF

BACKGROUND OF THE INVENTION

Field of the Invention

The present invention relates to a semiconductor device and a control method thereof, and more particularly relates to a semiconductor device including an electrical fuse and capable of reading whether the electrical fuse is programmed or not without any erroneous determination, and to a control method thereof.

Description of Related Art

In a semiconductor device such as a DRAM (Dynamic Random Access Memory), a defective address is relieved by replacing a defective cell that does not operate properly with a redundant cell. For example, an electrical fuse is used for storing of defective addresses. The electrical fuse is made of a material mainly including copper, impurity-doped polysilicon or the like, and it is electrically conductive at an initial state. The electrical fuse is set to be a non-conductive state by generating heat by passing an electric current into the electrical fuse so as to disconnect it, and thus defective addresses can be stored in a non-volatile manner. Therefore, a desired address can be stored by providing a plurality of such electrical fuses and by disconnecting a desired fuse element. In this manner, an ordinary electrical fuse stores information in a non-volatile manner by changing the fuse itself from a conductive state to a non-conductive state (see Japanese Patent Application Laid-open No. 2007-329196).

However, as described in Japanese Patent Application Laid-open No. 2007-329196, there are cases where, even when known electrical disconnection or programming is performed on electrical fuses, the disconnection is not made as intended. That is, although disconnection processing is performed on plural electrical fuses, not all of the electrical fuses on which the disconnection processing has been performed are sufficiently disconnected. Consequently, insufficient disconnection causes the electrical fuses not to be completely non-conductive, and thus at the time of reading, there is a problem that electrical fuses that are supposed to be in a non-conductive or programmed state are erroneously determined as conductive or non-programmed state.

Meanwhile, similarly to the electrical fuse described in Japanese Patent Application Laid-open No. 2007-329196, there is known an anti-fuse as a type of an electrical fuse that uses electricity to change its state, which is conductive or non-conductive. Contrary to the electrical fuse of Japanese Patent Application Laid-open No. 2007-329196, the anti-fuse is an element that stores information by changing its state as a non-conductive or non-programmed state to a conductive or programmed state. Writing or programming of information into the anti-fuse is performed by insulation breakdown due to application of a high voltage. In the case of the anti-fuse, similarly to the case of the electrical fuse described in Japanese Patent Application Laid-open No. 2007-329196, in a strict sense, the result of the programming differs in each of electrical fuses. That is, there are various results such as an electrical fuse with a high conducting level (that is, its resistance is low), that with a low conducting level (that is, its resistance is high), or that having failed with conduction (its resistance is particularly high).

SUMMARY

The present invention provides a semiconductor device that is capable of reading the state of each of these electrical fuses in various conductive states without any erroneous determination, and a control method of the semiconductor device.

In one embodiment, there is provided a semiconductor device that includes: an electrical fuse connected to a detection node via a selective transistor; a precharge transistor that precharges the detection node in a state where the selective transistor is in an OFF state; a bias transistor that passes a bias current to the detection node in a state where the selective transistor is in an ON state and the precharge transistor is in an OFF state; and a detection circuit that detects a potential of the detection node in a state where the bias current is flowing into the detection node, wherein the bias transistor gradually reduces an amount of the bias current.

In one embodiment, there is provided control method of a semiconductor device that includes: supplying a first current to an end of an electrical fuse in a first time period; supplying a second current that is smaller than the first current to the end of the electrical fuse in a second time period subsequent to the first time period; and determining whether the electrical fuse is programmed in the first and second time periods by detecting a potential of the end of the electrical fuse.

BRIEF DESCRIPTION OF THE DRAWINGS

The above and other features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
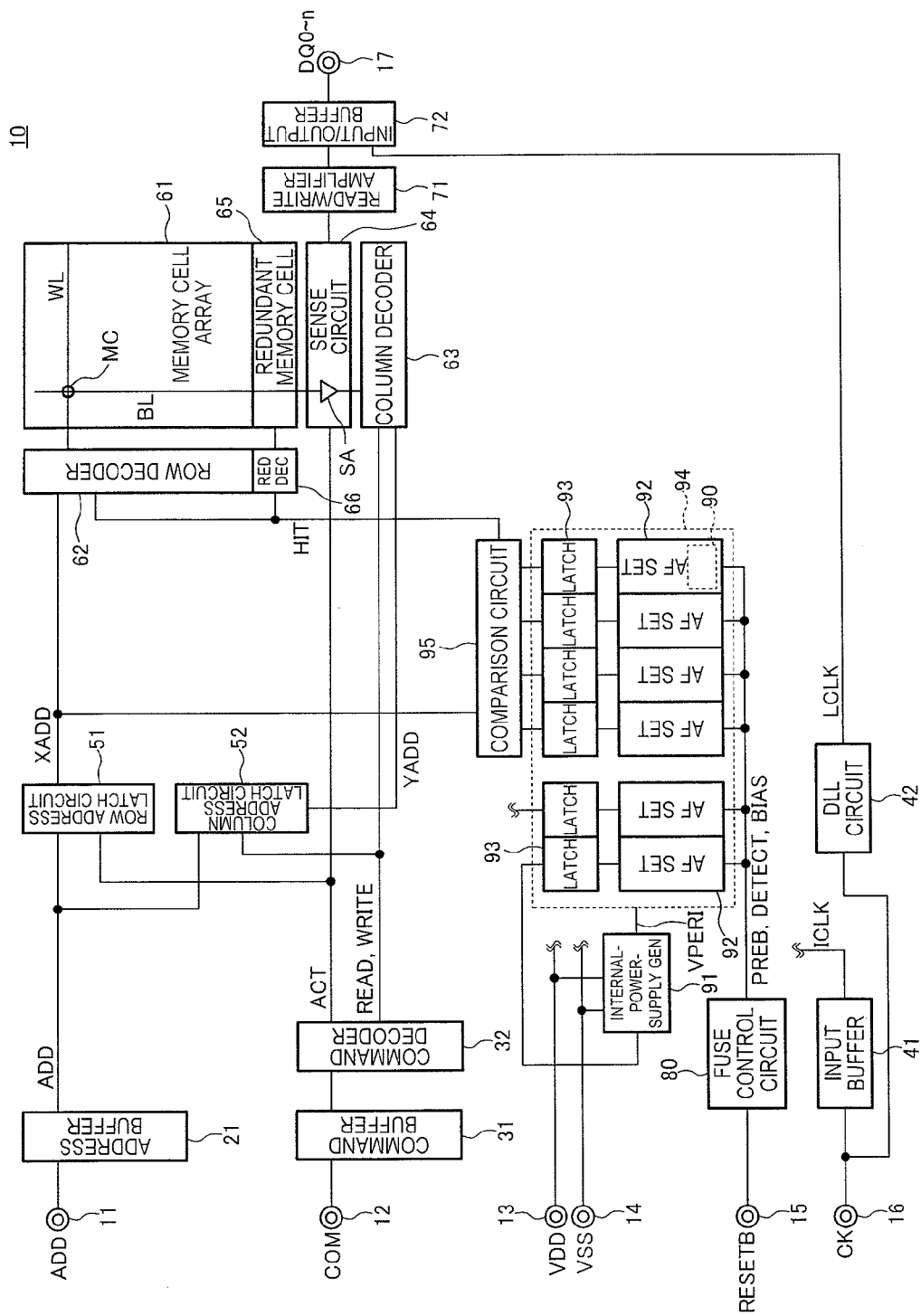
FIG. 1 is a block diagram showing a configuration of a semiconductor device 10 according to an embodiment of the present invention.

Referring now to FIG. 1, the semiconductor device 10 according to the present embodiment is a DRAM that is integrated in a single semiconductor chip. As external terminals of the semiconductor device 10, an address terminal 11, a command terminal 12, power-supply terminals 13 and 14, a reset terminal 15, a clock terminal 16, and a data input/output terminal 17 are provided. While other terminals such as a data strobe terminal are provided in the semiconductor device 10, these are omitted from the drawings.

The address terminal 11 is supplied with an address signal ADD. The address signal ADD is supplied to an address buffer 21. The output signal ADD from the address buffer 21 is supplied to a row address latch circuit 51 and a column address latch circuit 52. Among address signals ADD latched by the row address latch circuit 51, a row address XADD is supplied to a row decoder 62, and a column address YADD is supplied to a column decoder 63.

The command terminal 12 is supplied with command signals COM including a row-address strobe signal RAS, a column-address strobe signal CAS, a write enable signal WE, and a chip select signal CS. These command signals COM are supplied to a command buffer 31. These command signals COM supplied to the command buffer 31 are then supplied to a command decoder 32. The command decoder 32 is a circuit that generates various types of internal commands such as ACT, READ, and WRITE by holding, decoding, and counting these command signals. The generated command signals are supplied to the row address latch circuit 51, the column address latch circuit 52, and the column decoder 63.

The power-supply terminals 13 and 14 are supplied with a power-supply voltage VDD and a ground potential VSS, respectively. The power-supply voltage VDD and the ground potential VSS supplied to these power-supply terminals are then supplied to an internal-power-supply generating circuit 91, and the internal-power-supply generating circuit 91 generates an internal voltage VPERI. Furthermore, the internal-power-supply generating circuit 91 also generates potentials for program signals PROG_A and PROG_B that are necessary for programming an anti-fuse described later.

The reset terminal 15 is supplied with a reset signal RESETB, which is activated at the time of turning the power on. The supplied reset signal RESETB is supplied to a fuse control circuit 80.

The clock terminal 16 is supplied with an external clock signal CK. The external clock signal CK supplied to the clock terminal 16 is then supplied to an input buffer 41 and a DLL circuit 42. The input buffer 41 generates an internal clock signal ICLK upon reception of the external clock signal CK. The DLL circuit 42 generates an internal clock signal LCLK, and the generated internal clock signal LCLK is supplied to an input/output buffer 72.

The data input/output terminal 17 is a terminal that outputs read data DQ0 to DQn and inputs write data DQ0 to DQn, and is connected to the input/output buffer 72. The input/output buffer 72 outputs read data synchronously with the internal clock signal LCLK at the time of a reading operation.

The row decoder 62 selects any of word lines WL included in a memory cell array 61 based on the row address XADD. A plurality of the word lines WL and a plurality of bit lines BL are intersecting each other in the memory cell array 61, and memory cells MC are arranged at each of the intersections (only one word line WL, one bit line BL, and one memory cell MC are shown in FIG. 1). The bit line BL is connected to a corresponding sense amplifier SA in a sense circuit 64.

The column address YADD is supplied to the column decoder 63. The column decoder 63 selects any of the sense amplifiers SA included in the sense circuit 64 based on the column address YADD. The sense amplifier SA selected by the column decoder 63 is connected to a read/write amplifier 71. The read/write amplifier 71 further amplifies read data amplified by the sense amplifier SA at the time of a reading operation, and the further amplified read data is supplied to the input/output buffer 72. On the other hand, at the time of a writing operation, write data supplied from the input/output buffer 72 is amplified and the amplified write data is supplied to the sense amplifier SA.

The fuse control circuit 80 supplies a precharge signal PREB, a detection signal DETECT, and a bias voltage BIAS to an anti-fuse circuit 94 upon reception of the reset signal RESETB. Details of the fuse control circuit 80 are explained later.

The anti-fuse circuit 94 is constituted by a plurality of anti-fuse sets (AF sets) 92 and a plurality of latch circuits 93. The internal voltage VPERI generated by the internal-power-supply generating circuit 91 is supplied to the anti-fuse circuit 94.

Among the anti-fuse circuits 94, the anti-fuse circuit 94 shown on the leftmost side of FIG. 1 is an anti-fuse circuit for power-supply adjustment, and its output is input to the internal-power-supply generating circuit 91. Furthermore, the anti-fuse circuit 94 that is shown on the right side of FIG. 1 and is connected to a comparison circuit 95 is an anti-fuse circuit 94 for relieving row addresses. In addition, the anti-fuse circuit 94 that is shown second from the left side of FIG. 1 is an anti-fuse circuit for adjusting other functions.

The anti-fuse circuit 94 reads whether an anti-fuse element included in each of the anti-fuse sets 92 is programmed or not, based on the detection signal DETECT generated from the fuse control circuit 80 having received the reset signal RESETB, which is activated at the time of turning the power on, and the read result is held in each of the latch circuits 93. Details of the anti-fuse circuit 94 are explained later.

Each piece of information held in each of the latch circuits 93 is respectively compared with each bit of the row address XADD by the comparison circuit 95, and a hit signal HIT is activated when there is a match between the information and the bit. Thereafter, based on the hit signal HIT, a redundant row decoder 66 is operated simultaneously with stopping of an operation of the row decoder 62 corresponding to a matched row address, and a redundant memory cell 65 is selected. On the other hand, when there is no match between the information and the bit, the hit signal HIT is not activated, and thus an operation of the row decoder 62 corresponding to the row address is performed, and the redundant row decoder 66 is not operated. In this manner, a normal cell with a defect is replaced by a redundant cell.

Figure 2:
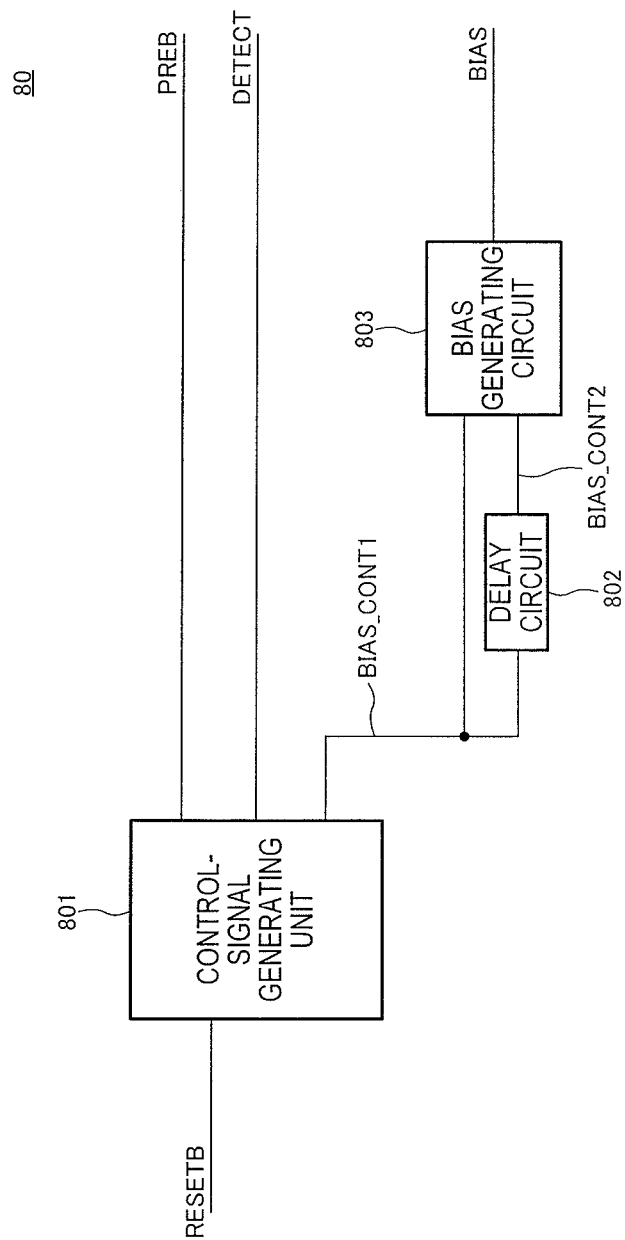
FIG. 2 is a circuit diagram showing a configuration of a fuse control circuit 80 shown in FIG. 1.

Turing to FIG. 2, the fuse control circuit 80 is configured to include a control-signal generating unit 801, a delay circuit 802, and a bias generating circuit 803.

The control-signal generating unit 801 generates the precharge signal PREB, the detection signal DETECT, and a first bias control signal BIAS_CONT1 upon reception of the reset signal RESETB. The first bias control signal BIAS_CONT1 is supplied to the delay circuit 802. The delay circuit 802 outputs a second bias control signal BIAS_CONT2 that is delayed for a predetermined time from the first bias control signal BIAS_CONT1. The first and second bias control signals BIAS_CONT1 and BIAS_CONT2 are supplied to the bias generating circuit 803, and the bias generating circuit 803 combines the first and second bias control signals BIAS_CONT1 and BIAS_CONT2 and outputs the combined signal as the bias voltage BIAS. Specifically, the bias voltage BIAS is set to be a relatively low level upon activation of the first bias control signal BIAS_CONT1, and the bias voltage BIAS is set to be a relatively high level upon activation of the second bias control signal BIAS_CONT2.

Figure 3:
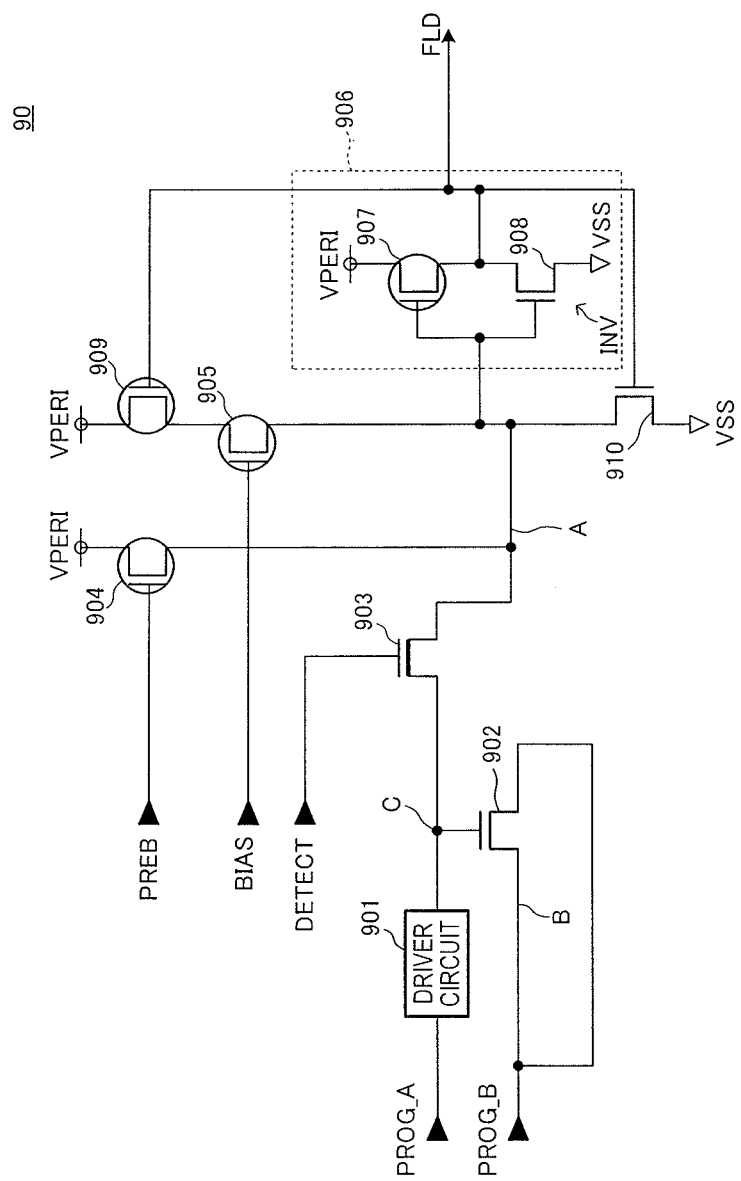
FIG. 3 is a circuit diagram showing a configuration of an anti-fuse readout circuit 90 for one bit shown in FIG. 1.

Turing to FIG. 3, the anti-fuse readout circuit 90 is included in a predetermined anti-fuse set 92 shown in FIG. 1.

As shown in FIG. 3, the anti-fuse readout circuit 90 is configured to include a driver circuit 901, a transistor-type anti-fuse 902, a selective transistor (an N-type transistor) 903, a precharge transistor (a P-type transistor) 904, a bias transistor (a P-type transistor) 905, and a detection circuit 906. The first program signal PROG_A is input to the driver circuit 901. In the anti-fuse 902, a source electrode and a drain electrode are connected to a node B to which the second program signal PROG_B is supplied, and a gate electrode is connected to a node C to which an output from the driver circuit 901 is supplied. The selective transistor 903 is connected between a detection node A and the gate electrode of the anti-fuse 902, and the detection signal DETECT is input to the gate electrode. The precharge transistor 904 is connected between the internal voltage VPERI (a power-supply line) and the detection node A, and the precharge signal PREB is input to a gate electrode of the precharge transistor 904. In the bias transistor 905, the bias voltage BIAS is input to a gate electrode. The detection circuit 906 detects the potential of the detection node A.

The detection circuit 906 includes an inverter INV that is serially connected between the internal voltage VPERI and the ground potential VSS. The inverter INV is constituted by a P-type transistor 907 and an N-type transistor 908. An input terminal of the inverter INV is connected to the detection node A, and fuse latch data FLD is output from an output terminal of the inverter INV according to the potential of the detection node A.

The anti-fuse readout circuit 90 further includes a feedback transistor 909 (a P-type transistor) which is connected between the internal voltage VPERI (a power-supply line) and the bias transistor 905 and a discharge transistor 910 (an N-type transistor) which is connected between the detection node A and the ground potential VSS. The fuse latch data FLD is input to the gate electrode of the feedback transistor 909 and the gate electrode of the discharge transistor 910.

In order to program the anti-fuse 902 in the anti-fuse readout circuit 90 with the above configuration, the first program signal PROG_A is set to a high voltage, and the second program signal PROG_B is set to a low voltage. With this setting, a gate dielectric film of the anti-fuse 902 is broken-down, thereby the node B and the node C are electrically connected (short-circuited), and the anti-fuse 902 is in a programmed state.

A reading operation of the anti-fuse 902 is explained next.

An outline of the reading operation is explained first. The present embodiment has a technical feature such that reading of the anti-fuse 902 is performed with two steps.

That is, at the first step, the supply of a bias current to an end (the node C) of each anti-fuse 902 is increased by reducing the potential of the bias voltage BIAS. Thereby, the anti-fuse 902 having a high conducting level is read first. Meanwhile because current draw amount is small relative to the current supply amount in the anti-fuse 902 having a low conducting level, the reading time of the anti-fuse 902 having a low conducting level becomes longer, or the reading itself becomes impossible. That is, the first step is a step of reading the anti-fuse 902 having a high conducting level.

The second step is a step where the potential of the bias voltage BIAS is increased so as to reduce the supply of a bias current to the end (the node C) of each anti-fuse 902, thereby accelerating the reading of the anti-fuse 902 having a low conducting level.

Accordingly, any anti-fuse having either a high conducting level or a low conducting level can be read without any erroneous determination by these first and second steps.

Figure 4:
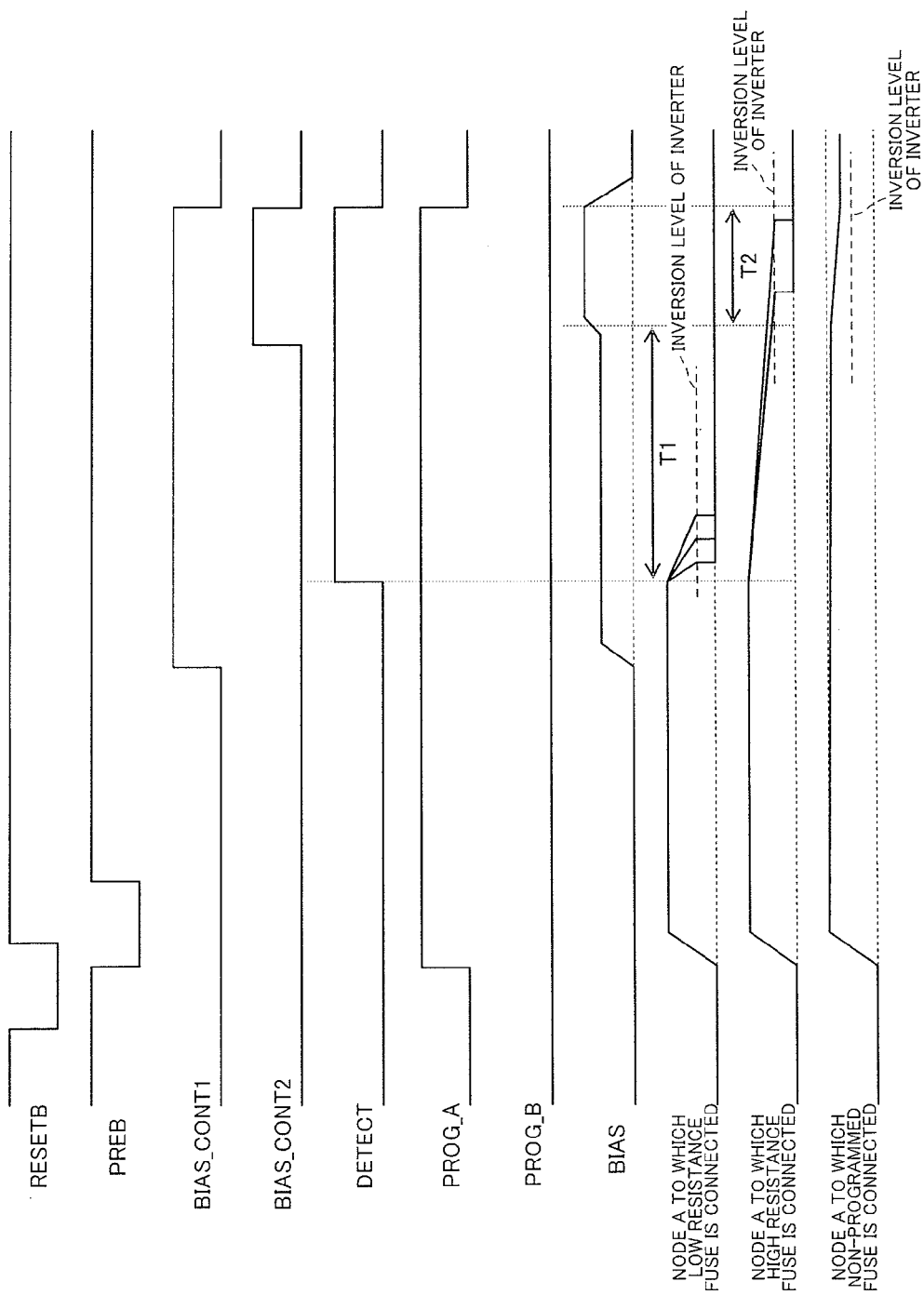
FIG. 4 is a timing diagram for explaining an operation of the anti-fuse reading circuit 90 shown in FIG. 3.

The reading operation of the anti-fuse 902 is explained next with reference to a timing diagram of FIG. 4.

First, the precharge signal PREB is activated to a low level for a predetermined period of time by activating the reset signal RESETB to a low level. By this activation, the precharge transistor 904 is turned on, and the detection node A is precharged to a VPERI level (a high level). After turning off the precharge transistor 904, the level of the bias voltage BIAS is increased to some extent according to the first bias control signal BIAS_CONT1. Thereafter, the detection signal DETECT is activated to a high level. At this time, the driver circuit 901 is in an off-state, and the second program signal PROG_B is equal to the ground potential VSS.

In this state, when the anti-fuse 902 is non-programmed (that is, not being insulation broken-down), the detection node A is kept to be a high level, and thus the level of the detection node A does not become lower than an inversion level (a threshold value) of the inverter INV of the detection circuit 906, and the fuse latch data FLD is settled to be a low level. That is, it is detected that the potential of the detection node A is at a high level and determined that the anti-fuse 902 is not programmed.

On the other hand, when the anti-fuse 902 is programmed, a current path is formed between the node B that is equal to the ground potential VSS and the feedback transistor 909, via the bias transistor 905 and the selective transistor 903. At this time, the level of the detection node A to which the anti-fuse 902 with a high conducting level (that is, its resistance is low) is connected is smoothly reduced to a low level, and this level quickly becomes lower than the inversion level (the threshold value) of the inverter INV of the detection circuit 906 (see "NODE A TO WHICH LOW RESISTANCE FUSE IS CONNECTED" in FIG. 4). Consequently, the fuse latch data FLD, which is an output of the detection circuit 906, becomes a high level. In this manner, because the gate electrode of the feedback transistor 909 becomes a high level, the feedback transistor 909 becomes an off-state, and the supply of a current to the detection node A is stopped. Furthermore, because the discharge transistor 910 becomes an on-state, the potential of the detection node A is reduced to the ground potential VSS. Therefore, in the anti-fuse readout circuit 90 including the anti-fuse 902 with a high conducting level (that is, its resistance is low), the fuse latch data FLD as an output of the anti-fuse readout circuit 90 is settled to be a high level. That is, it is detected that the potential of the detection node A is at a low level and determined that the anti-fuse 902 is programmed.

In the state described above, an accurate determination has not been made yet for some anti-fuses 902 with a poor disconnection state (their conducting level is low) at the time when a period of time T1 has elapsed.

When the anti-fuse 902 is programmed and its conducting level is low (that is, its resistance is high), a current path is formed between the node B that is equal to the ground potential VSS and the feedback transistor 909, via the bias transistor 905 and the selective transistor 903. However, in this state, because the conducting level of the anti-fuse 902 is low, the potential of the detection node A is hardly reduced. Therefore, in the time period T1, the potential of the detection node A cannot be lower than the inversion level (the threshold value) of the inverter INV, and thus the output of the inverter INV remains to be a low level. However, in the present embodiment, as the time period T1 elapses from activation of the detection signal DETECT, the bias control signal BIAS_CONT2 as an output of the delay circuit 802 (see FIG. 2) becomes a high level, and correspondingly the level of the bias voltage BIAS is further increased. Accordingly, the current supplying capability of the bias transistor 905 is decreased, and thus the current supplied to the detection node A is reduced (becomes less). Therefore, it becomes easier to reduce the potential of the detection node A even with the anti-fuse 902 with a low conducting level, and thus, in a period of time T2, the potential of the detection node A can be lower than the inversion level of the inverter INV, and the fuse latch data FLD as an output of the anti-fuse readout circuit 90 can be set to a high level. Thereafter, similarly to the anti-fuse readout circuit 90 including the anti-fuse 902 with a high conducting level described above, in the anti-fuse readout circuit 90 including the anti-fuse 902 with a low conducting level, the gate electrode of the feedback transistor 909 becomes a high level, the feedback transistor 909 is in an off-state, the current supply to the detection node A is stopped, and the discharge transistor 910 is in an on-state, thereby reducing the potential of the detection node A to the ground potential VSS. Therefore, the fuse latch data FLD as an output of the anti-fuse readout circuit 90 is settled to be a high level. That is, it is detected that the potential of the detection node A is at a low level and determined that the anti-fuse 902 is programmed.

With the above configuration, an accurate determination can be made even for the anti-fuses 902 with a poor disconnection state (their conducting level is low) at the time when the time periods T1 and T2 have elapsed.

As described above, in the present embodiment, reading of the anti-fuse 902 is performed with two steps. That is, by setting the potential of the bias voltage BIAS from low to high (that is, the amount of a bias current to the detection node A is reduced in a stepwise manner), it is possible to read the state of each of the anti-fuses 902 in various conductive states without any erroneous determination.

In this connection, for example, when the bias voltage BIAS is set to a high level from an initial stage (that is, when the amount of a bias current to the detection node A is small), currents flow instantly in many anti-fuses 902, and therefore there is a possibility of an erroneous determination due to the level of the node B (VSS) being up. Therefore, in the present embodiment, reading of the majority of the anti-fuses 902 is completed at the first step and the bias voltage BIAS is set to a high level only at the second step, thereby enabling to prevent occurrence of erroneous determinations due to the level of the node B being up.

Furthermore, because reading of the majority of the anti-fuses 902 is completed at the first step and reading of the rest of (a small number of) anti-fuses 902 is performed at the second step, the second time period T2 is set to be shorter than the first time period T1.

When the bias voltage BIAS is maintained to be a low level by using along determination time, respective leakages of the anti-fuse readout circuit 90 including a non-programmed anti-fuse 902 (particularly, leakages due to the discharge transistor 910) causes the potential level of the detection node A to be lower. Therefore, there is a possibility that even non-programmed anti-fuses 902 may be erroneously determined as programmed ones (see the level lowering of "NODE A TO WHICH NON-PROGRAMMED FUSE IS CONNECTED" in FIG. 4). Therefore, it is not preferable to have the time period T1 to be excessively long. Accordingly, in the present embodiment, the bias voltage BIAS is set to be high only at the second step so that a determination is made quickly before charge emissions due to the leakage during the time period T1 ends.

Figure 5:
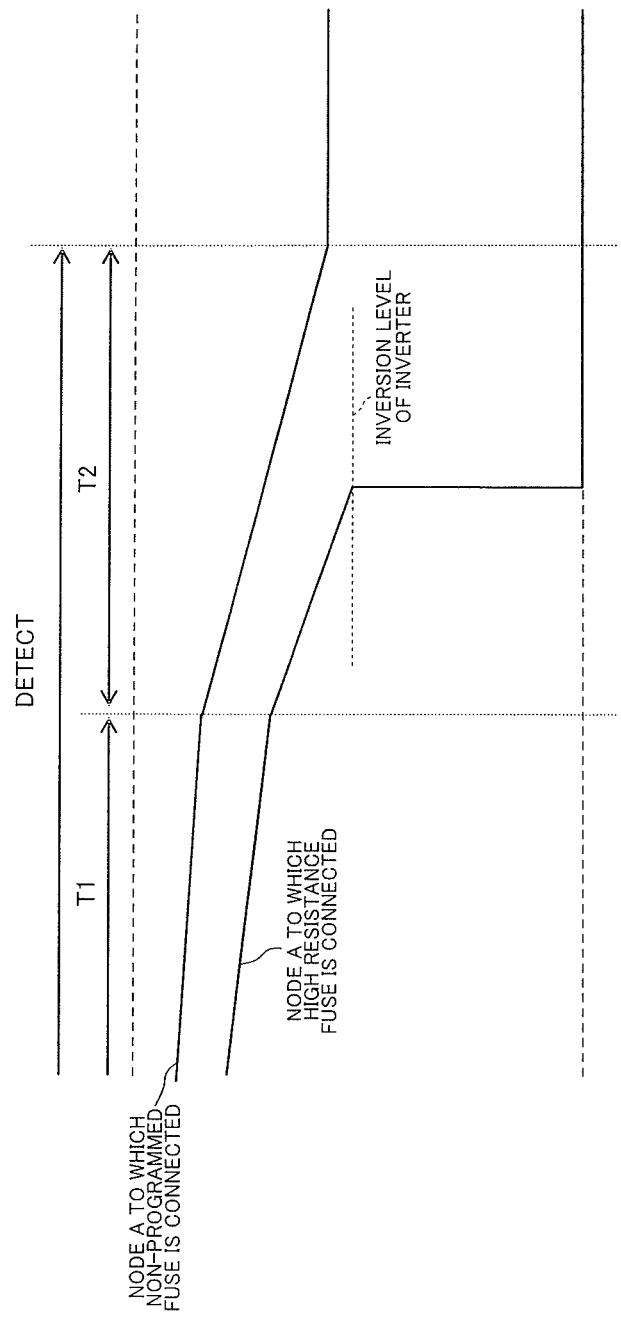
FIG. 5 is a timing diagram showing a detailed level change of a programmed anti-fuse 902 with a poor disconnection state (its conducting level is high) and of a non-programmed anti-fuse 902.

Turning to FIG. 5, in the time period T2 where the level of the bias voltage BIAS is increased, the potential of the detection node A to which the non-programmed anti-fuse 902 is connected is largely reduced as compared to the case in the time period T1, and the level is lowered to be close to an inversion level of the inverter INV at the end of the time period T2. In this sense, it is not preferable to set the time period T2 to be excessively long. Therefore, it is necessary to set the time period T2 to a time where the potential of the detection node A to which the anti-fuse 902 having a high resistance is connected can be lower than the inversion level of the inverter INV, and the potential of the detection node A to which the non-programmed anti-fuse 902 is connected can be maintained to be higher than the inversion level of the inverter INV.

It is apparent that the present invention is not limited to the above embodiments, but may be modified and changed without departing from the scope and spirit of the invention.

For example, an anti-fuse circuit for relieving row addresses, an anti-fuse circuit for power-supply adjustment, and an anti-fuse circuit for adjusting other functions have been exemplified as the anti-fuse circuit according to the present invention; however, in the present invention, it is also possible to provide an anti-fuse circuit for relieving column addresses and anti-fuse circuits for adjusting still other functions.

In the above embodiment, while there has been explained an example where, in reading of the anti-fuse 902, the bias voltage BIAS is applied at separated two steps, the steps can be separated for three or more, and changing of the reading is not limited to a stepwise manner and can be a continuous manner. Furthermore, as for the level of the bias voltage BIAS, it is not essential to change it from low to high, and for example, when an N-channel MOS transistor is used as a bias transistor, contrary to the explanations of the above embodiment, the level of the bias voltage BIAS can be changed from high to low.

What is claimed is:

1. A semiconductor device comprising:
a fuse circuit including a fuse element and a circuit node operatively connected to the fuse element;
a first transistor configured to precharge the circuit node;
a second transistor and a third transistor connected in series between the circuit node and a voltage line;
a control circuit configured to control the second transistor in response to a level at the circuit node; and
a bias generating circuit configured to supply a gate of the third transistor with a bias voltage and to control the bias voltage to take a first level and then change from the first level to a second level, each of the first and second levels being greater than a threshold level of the third transistor.

2. The semiconductor device as claimed in claim 1, wherein the fuse circuit further includes a switch coupled between the fuse element and the circuit node.

3. The semiconductor device as claimed in claim 2, wherein the switch is configured to be turned ON after the first transistor is turned OFF to stop precharging the circuit node.

4. The semiconductor device as claimed in claim 3, wherein the control circuit is configured to output first data when the level at the circuit node is greater than a first potential and second data when the level at the circuit node is lower than the first potential, the second transistor being configured to be turned ON in response to the first data and to be turned OFF in response to the second data.

5. The semiconductor device as claimed in claim 4, wherein the control circuit comprises an inverter circuit and the first potential is substantially equal to a logical threshold voltage of the inverter circuit.

6. The semiconductor device as claimed in claim 1, wherein the fuse element comprises an electrical fuse element.

7. The semiconductor device as claimed in claim 6, further comprising a driver circuit configured to supply a voltage to the electrical fuse element to program the electrical fuse element.

8. The semiconductor device as claimed in claim 7, wherein the fuse circuit further includes a switch coupled between the fuse element and the circuit node, the driver circuit being configured to supply the voltage to the electrical fuse element when the switch is in an OFF-state.

9. The semiconductor device as claimed in claim 8, wherein the switch circuit is configured to turn ON when the driver circuit is disabled.

10. The semiconductor device as claimed in claim 1, wherein the second transistor is of a P-type transistor and the first bias voltage is smaller than the second bias voltage.

* * * * *